(12) United States Patent
Chen et al.

(10) Patent No.: US 10,790,275 B2
(45) Date of Patent: Sep. 29, 2020

(54) ESD PROTECTION DEVICE WITH DEEP TRENCH ISOLATION ISLANDS

(71) Applicant: Texas Instruments Incorporated, Dallas, TX (US)

(72) Inventors: Zaichen Chen, Champaign, IL (US); Akram A. Salman, Plano, TX (US); Binghua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/198,506

(22) Filed: Nov. 21, 2018

(65) Prior Publication Data
US 2020/0161292 A1  May 21, 2020

(51) Int. Cl.
| H01L 29/00 | (2006.01) |
| H01L 27/02 | (2006.01) |
| H01L 29/08 | (2006.01) |
| H01L 29/10 | (2006.01) |
| H01L 29/66 | (2006.01) |
| H01L 21/265 | (2006.01) |
| H01L 29/06 | (2006.01) |
| H01L 29/732 | (2006.01) |

(Continued)

(52) U.S. Cl.
CPC .... *H01L 27/0259* (2013.01); *H01L 21/26513* (2013.01); *H01L 21/76224* (2013.01); *H01L 29/0649* (2013.01); *H01L 29/0804* (2013.01); *H01L 29/0821* (2013.01); *H01L 29/1004* (2013.01); *H01L 29/66234* (2013.01); *H01L 29/732* (2013.01); *H01L 21/02532* (2013.01); *H01L 21/02579* (2013.01); *H01L 21/02595* (2013.01); *H01L 21/3212* (2013.01); *H01L 21/76877* (2013.01)

(58) Field of Classification Search
CPC ......... H01L 21/76224; H01L 21/76229; H01L 21/76283; H01L 21/76831; H01L 29/407; H01L 27/0218; H01L 27/0617; H01L 29/0615; H01L 29/0821; H01L 21/02595; H01L 27/088; H01L 29/0623; H01L 29/0642; H01L 29/0878; H01L 29/7827; H01L 29/78603
USPC ......................................................... 257/508
See application file for complete search history.

(56) References Cited

U.S. PATENT DOCUMENTS

| 9,929,140 B2 | 3/2018 | Edwards et al. |
| 2008/0173949 A1* | 7/2008 | Ma .................. H01L 21/823878 |
| | | 257/371 |

* cited by examiner

*Primary Examiner* — Theresa T Doan
(74) *Attorney, Agent, or Firm* — Andrew R. Ralston; Charles A. Brill; Frank D. Cimino

(57) ABSTRACT

An electronic device includes a substrate having a second conductivity type including a semiconductor surface layer with a buried layer (BL) having a first conductivity type. In the semiconductor surface layer is a first doped region (e.g., collector) and a second doped region (e.g., emitter) both having the first conductivity type, with a third doped region (e.g., a base) having the second conductivity type within the second doped region, wherein the first doped region extends below and lateral to the third doped region. At least one row of deep trench (DT) isolation islands are within the first doped region each including a dielectric liner extending along a trench sidewall from the semiconductor surface layer to the BL with an associated deep doped region extending from the semiconductor surface layer to the BL. The deep doped regions can merge forming a merged deep doped region that spans the DT islands.

23 Claims, 12 Drawing Sheets

(51) Int. Cl.
    *H01L 21/762*     (2006.01)
    *H01L 21/768*     (2006.01)
    *H01L 21/02*     (2006.01)
    *H01L 21/321*     (2006.01)

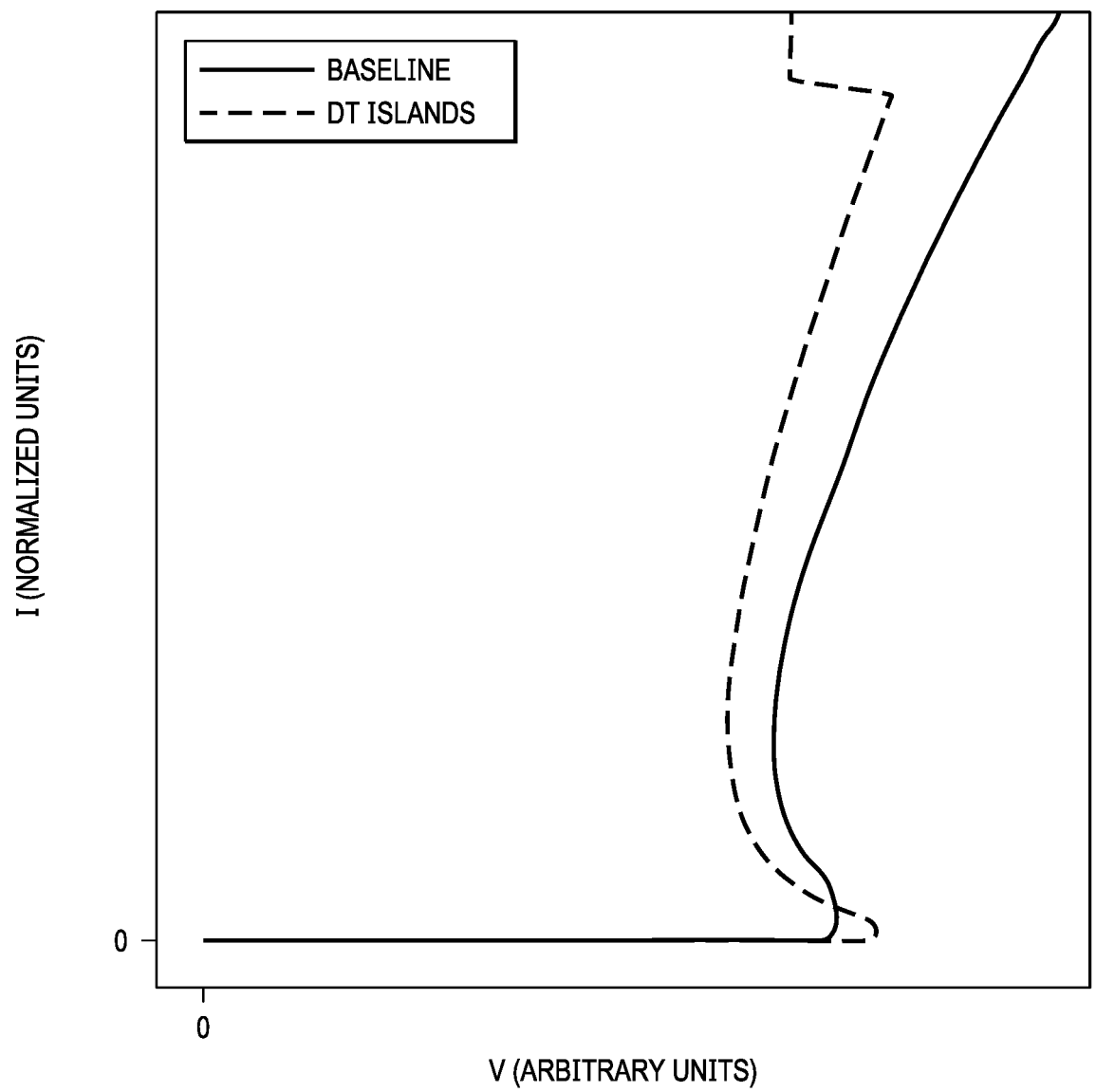

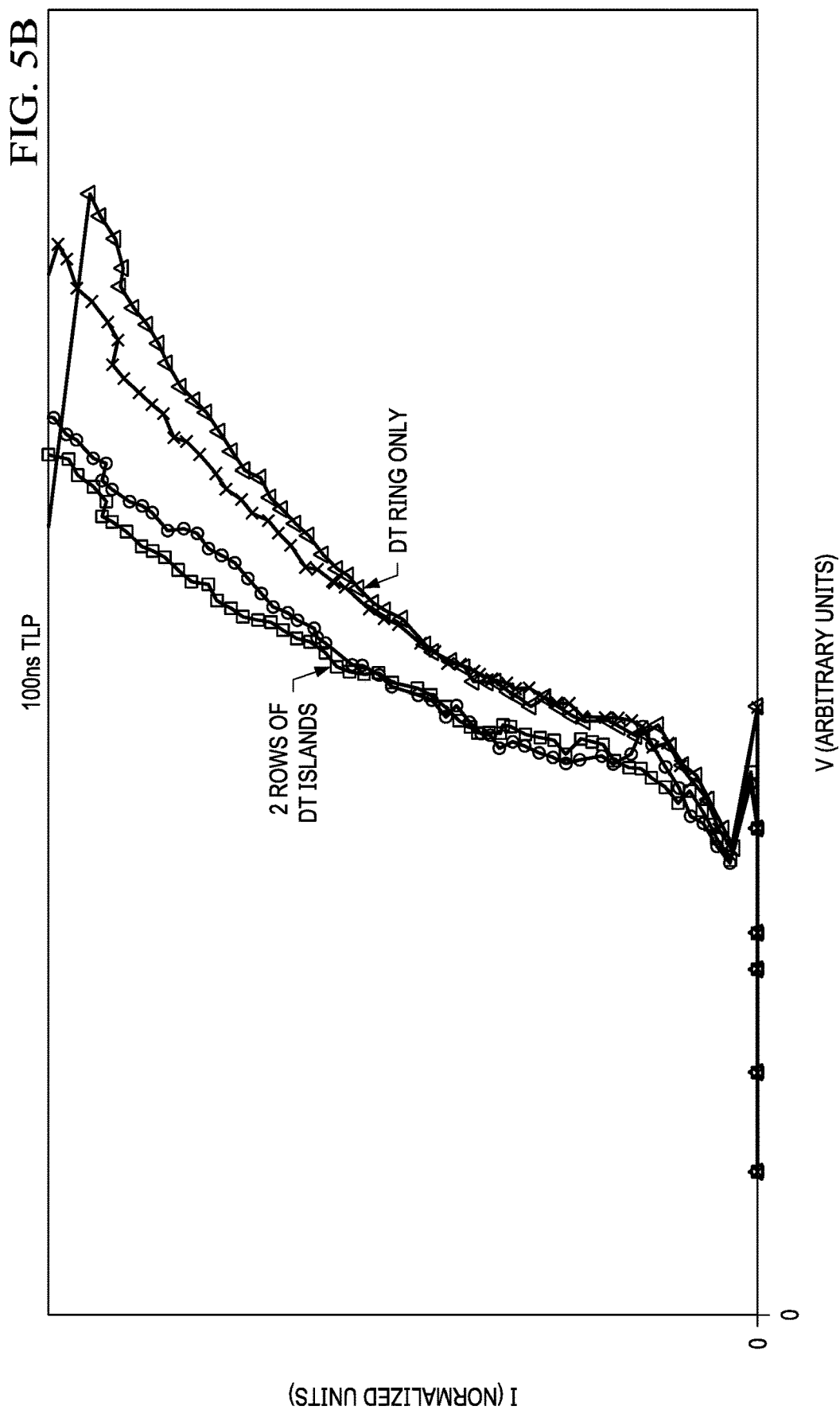

ESD PROTECTION DEVICE WITH DEEP TRENCH ISOLATION ISLANDS

FIELD

This Disclosure relates generally to electronic devices, and more particularly but not exclusively to vertical bipolar transistor-based ESD protection devices.

BACKGROUND

For certain devices, such as for Bipolar Complementary Metal Oxide Semiconductor (BiCMOS)-based integrated circuit (IC) devices, vertical bipolar-based electrostatic discharge (ESD) protection devices can be used for ESD protection, particularly for certain low voltage MOS devices. For example, for realizing an NPN-based ESD protection device a single deep trench (DT) isolation ring can be placed surrounding the n-collector of the NPN transistor.

A preferred current path in ESD protection for a vertical bipolar-based ESD protection device generally goes through a deep highly doped region between a collector contact at the device surface and a buried layer (BL), where the BL extends laterally including under the base, and where the series resistance of the deep doped region sets the clamp voltage of the ESD protection device. For example, one deep highly doped region arrangement uses an angled ion implant to implant through the DT isolation ring aperture before trench filling to form a highly doped yet narrow (resistive) region at the DT isolation ring edge which connects to the BL.

SUMMARY

This Summary is provided to introduce a brief selection of disclosed concepts in a simplified form that are further described below in the Detailed Description including the drawings provided. This Summary is not intended to limit the scope of claimed subject matter.

This Disclosure includes an electronic device that comprises a substrate having a second conductivity type including a semiconductor surface layer with a BL having a first conductivity type. In the semiconductor surface layer is a first doped region (e.g., collector) and a second doped region (e.g., emitter) both having the first conductivity type, with a third doped region (e.g., base) having the second conductivity type, where the second doped region is within the third doped region. The first doped region includes a portion located below and laterally spaced apart from the second and third doped regions. At least one row of DT isolation islands is within the first doped region, each DT isolation island including a dielectric liner extending along a trench sidewall from the semiconductor surface layer to the BL, and an associated deep doped region extending from the semiconductor surface layer to the BL. The respective deep doped regions are merged to form a merged deep doped region that spans the plurality of DT isolation islands. While disclosed examples may be expected to provide improvements in various device operating parameters, no particular result is a requirement unless explicitly recited in a particular claim.

BRIEF DESCRIPTION OF THE DRAWINGS

Reference will now be made to the accompanying drawings, which are not necessarily drawn to scale, wherein:

FIG. 5A shows technology computer-aided design (TCAD) simulated normalized I-V characteristics of an ESD protection device comprising an NPN transistor with a single outer DT isolation ring and a disclosed ESD protection device with a single row of DT isolation islands having merged deep-n doping inside the DT ring.

FIG. 5B shows normalized measured I-V data comparing an ESD protection device comprising an NPN transistor with a single outer DT isolation ring to a disclosed ESD protection device with two staggered rows of DT isolation islands having merged deep-n doping for 100 ns Transmission Line Pulse (TLP) testing.

DETAILED DESCRIPTION

Figure 1A:
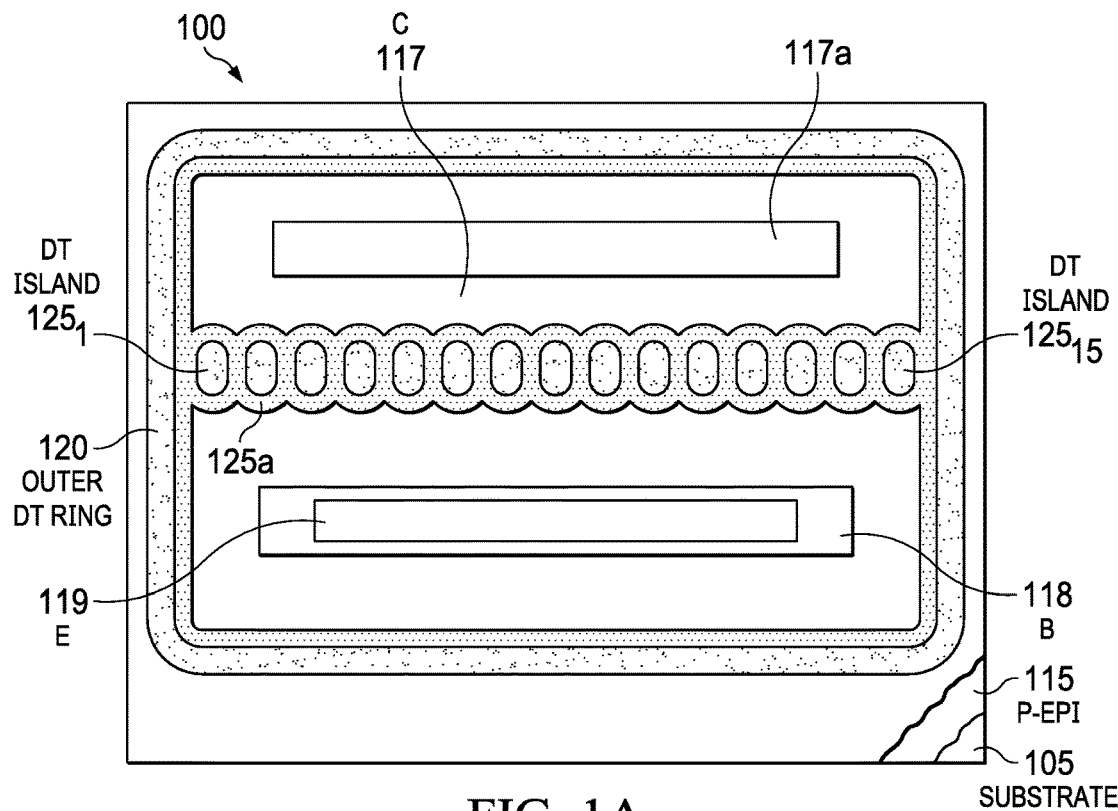
FIG. 1A is a top perspective view of a disclosed ESD protection device comprising a vertical NPN transistor with a plurality of DT isolation islands between the collector contact and the base in a single row with merged deep-n doping in the collector of the NPN transistor, with an optional outer DT isolation ring shown, according to a disclosed example.

This Disclosure is described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Disclosure recognizes that for some electronic devices, e.g. ESD protection bipolar transistors, that utilize a vertical current path through a highly doped deep region at the edge of a DT isolation ring (e.g., a deep-n region for NPN devices or deep-p region for PNP devices), the doped deep region may be too resistive to provide a satisfactory voltage clamp to adequately protect MOS devices due to the collector series resistance being too high. This Disclosure provides various arrangements that increase the total deep-n region or deep-p region cross-sectional area for lateral current flow that reduces the resistance of the deep doped region, thereby lowering its series resistance. This resistance reduction is expected to enable disclosed bipolar ESD protection devices to provide a satisfactory clamp voltage (typically a lower clamp voltage) over a wide range of operating conditions.

Figure 4:
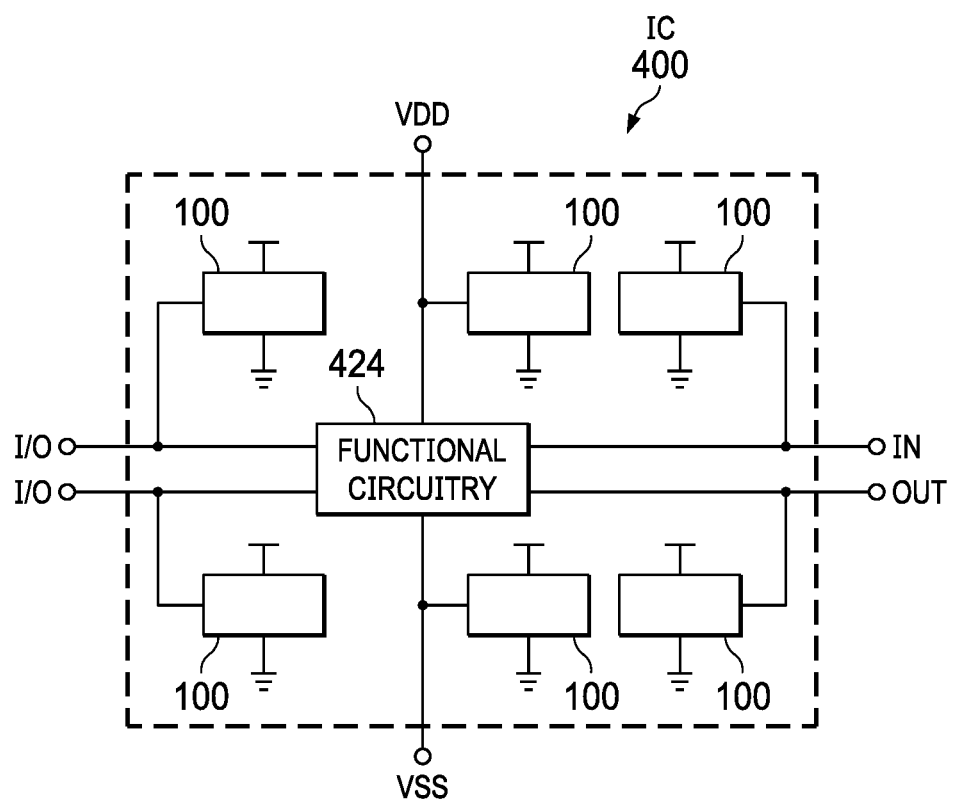
FIG. 4 illustrates a high level depiction of an ESD protected IC into which a plurality of disclosed ESD cells comprising an NPN transistor with DT isolation islands having merged deep-n doping are incorporated to protect one or more terminals of the IC, according to a disclosed example.

Disclosed ESD protection devices with DT isolation islands having a merged deep doped region may be implemented as stand-alone devices, or may be part of an IC, such as a BiCMOS IC die, typically with a plurality of ESD protection devices for protecting a plurality of nodes on the IC, such as shown in FIG. 4 described below. Although NPN-based ESD protection devices are generally described herein, it is clear to one having ordinary skill in the art to apply the described principles to form PNP-based ESD protection devices, e.g. by substituting n-doped regions with p-doped regions, and vice versa.

FIG. 1A is a top perspective view of a disclosed ESD protection device 100 with DT isolation islands 125$_1$ to 125$_{15}$ in a collector (C) 117 having a first doping type (more generally referred to as a first doped region), where the collector 117 has an associated collector contact 117a. A base (B) 118 has a second dopant type (more generally referred to as a third doped region), and an emitter (E) 119 has the first doping type (more generally referred to as a second doped region). The collector 117 extends laterally above from an n-type buried layer (NBL) 110 (see FIG. 2A, described below) from the collector contact 117a to the bottom of the base 118. The DT isolation islands 125$_1$ to 125$_{15}$ may be referred to collectively as DT islands 125. The DT islands 125 may also be referred to as dielectric structures, that may have an optional electrically conductive core (e.g., a doped polysilicon core doped the same doping type as the substrate) to enable an electrical connection to be provided to the substrate 105.

The DT isolation islands 125$_1$ to 125$_{15}$ are shown between the collector contact 117a and the base 118 that has an emitter 119 formed within, with the DT islands 125 arranged in a single row extending from the left side to the right side of the optional outer DT isolation ring 120 shown. The DT islands 125 are located within a merged deep-n region 125a. An n-type region such as a shallow n-well (SNW) 240 (see FIG. 2A described below) may be located at a surface of the merged deep-n region 125a, and may extend between the DT islands 125 and the outer DT ring 120 including at a surface of the collector contact 117a on the side opposing the base 118 and emitter 119 (top of FIG. 1A). The NBL 110, deep-n region 125a and SNW 240 may collectively operate as the collector 117 of the ESD protection device 100. The NBL 110 can be formed from one or more n-type implants, possibly including forming multiple epitaxial (epi) layers, to provide a desired dopant profile, as understood by those skilled in the pertinent art.

The collector contact 117a makes an electrical contact to the BL 110. The arrangements shown in FIG. 1A and FIG. 1B, described below, have the collector contact 117a outside the merged deep-n region 125a. Such an arrangement is made possible by n-type doping such as by the SNW 240 that extends between the merged deep-n region 125a and the collector contact 117a, with all these regions having the same doping type, here described as being n-type (same type as the collector 117). Alternatively, to provide a lower collector series resistance the collector contacts 117a can be placed within the merged deep-n region 125a in-between the DT islands, such as shown in FIG. 1C, FIG. 2A, FIG. 2B and FIG. 2C described below.

After the deep-n implant (for the case of NPN transistors) and diffusion process the merged deep-n region 125a shown is formed. The plurality of DT isolation islands 125$_1$ to 125$_{15}$ have a sufficiently small DT isolation island spacing so that adjacent ones of the deep-n diffusion regions form a single merged deep-n region 125a as shown to provide a merged/continuous wall of n-type material for NPN transistors. Although the row of DT islands 125 is shown extending the width of the ESD protection device 100, there is not such limitation for disclosed ESD protection devices (see FIG. 1D described below). Moreover, although the DT isolation islands are shown in FIG. 1A as being oval in shape, they can also be square in shape, or circular in shape which may minimize stress to the semiconductor surface layer shown as a p-epi layer 115.

In some examples, there is at least one semiconductor surface layer over the substrate 105, shown as the p-epi layer 115 over the substrate 105. However, in some examples the p-epi layer 115 may be omitted, such that the semiconductor surface layer is a surface region of the substrate 105. The substrate 105 and/or p-epi layer 115 as can comprise silicon, silicon-germanium, or other semiconductor material. The substrate 105 can comprise p-doped silicon having a doping level in a range from about $1\times10^{16}$ to about $1\times10^{19}$ cm$^{-3}$.

The outer DT isolation ring 120 and DT isolation islands 125$_1$ to 125$_{15}$ comprise a dielectric sidewall (e.g., silicon oxide), and can be entirely dielectric filled, or can be dielectric lined and filled with another material, such as doped polysilicon which can provide electrical contact to the substrate 105 or the p-epi layer 115 below the BL 110. In the case of a p-epi layer 115, the doped polysilicon will typically also be p-type.

Figure 1B:
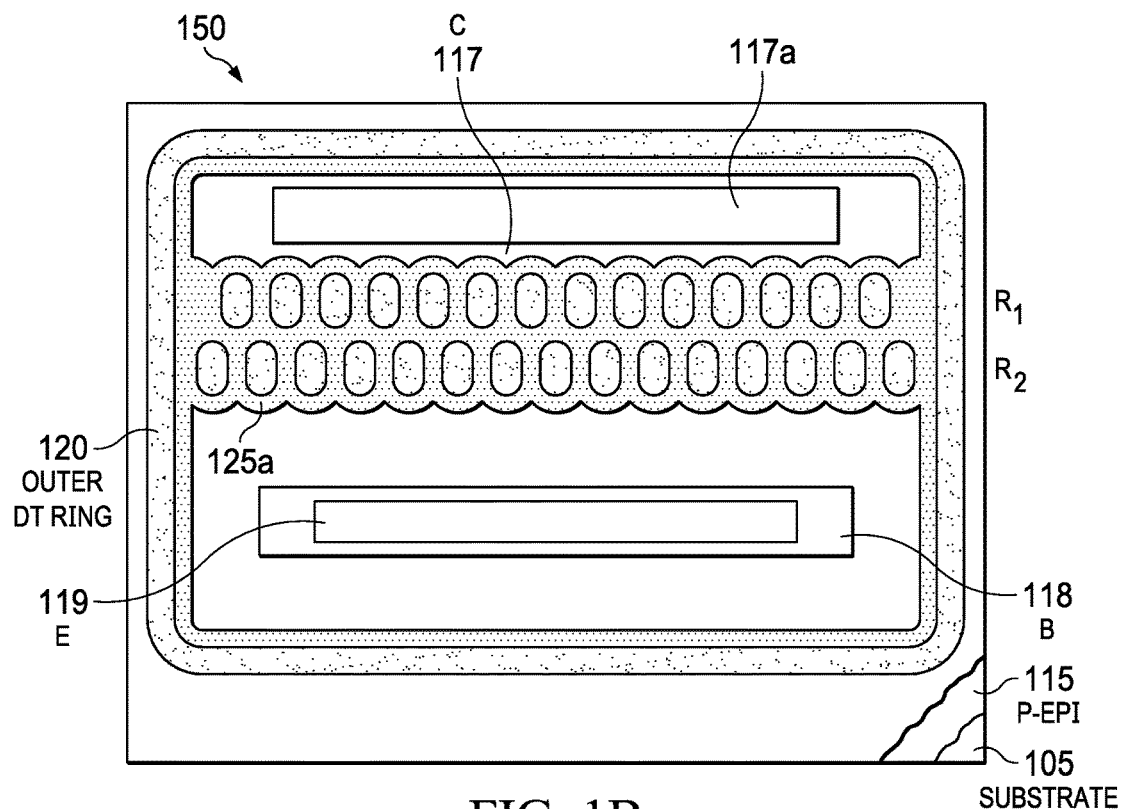
FIG. 1B is a top perspective view of a disclosed ESD protection device comprising a vertical NPN transistor with DT isolation islands between the collector contact and the base with merged deep-n doping showing two rows of DT isolation islands staggered from one another both placed in the collector of the NPN transistor, with an optional outer DT isolation ring again shown, according to a disclosed example.

FIG. 1B is a top perspective view of a disclosed ESD protection device 150 with DT isolation islands in the collector 117 between the collector contact 117a and the base 118 with a merged deep-n region 125a having two rows of DT islands shown as $R_1$ and $R_2$ staggered relative to one another, again with an optional outer DT isolation ring 120 shown, according to a disclosed example. A staggered DT configuration is recognized to increase the deep doping region cross sectional area and also provide some ballasting (e.g. extra resistance between the collector contact 117a and the emitter 119) that may improve the current conduction of the bipolar device under snapback conditions.

Figure 1C:
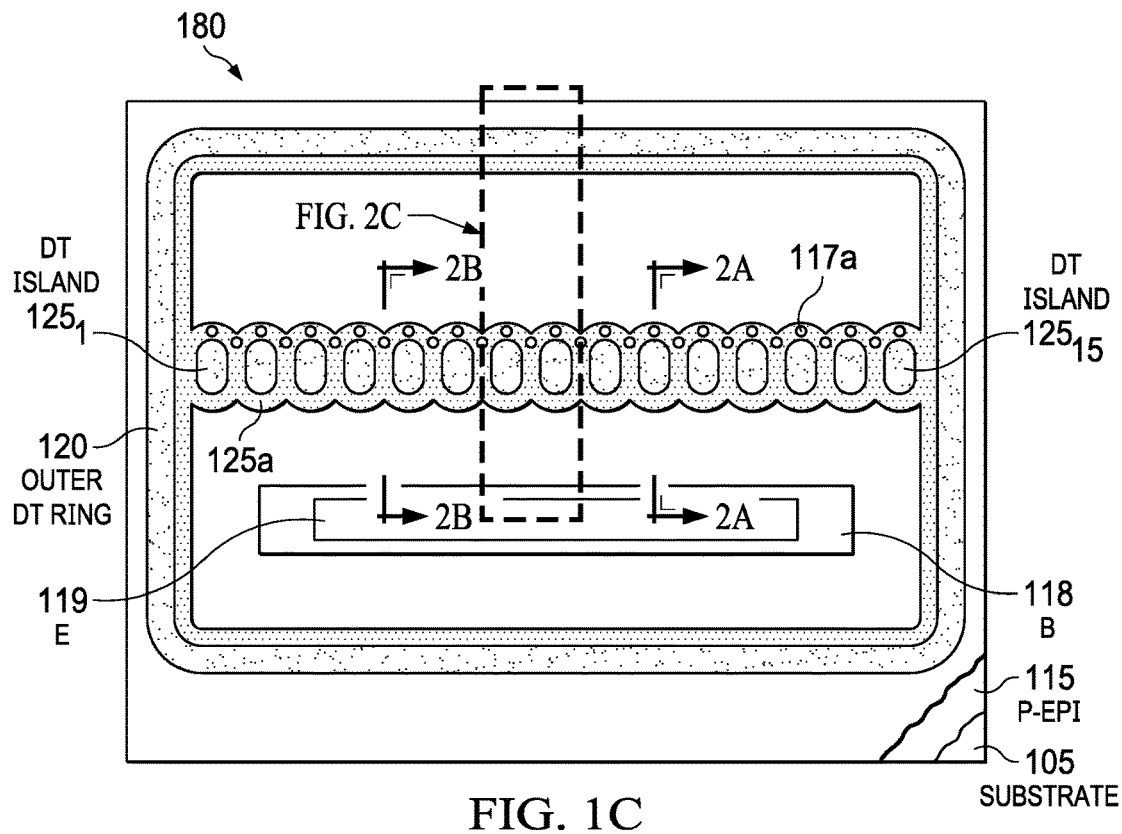
FIG. 1C is a top perspective view of a disclosed ESD protection device comprising a vertical NPN transistor with a plurality of DT isolation islands between the collector contact and the base and emitter, with the DT isolation islands in a single row shown with a merged deep-n doping region, with an optional outer DT isolation ring again shown, where the collector contacts are within the deep-n doped region, according to a disclosed example.

FIG. 1C is a top perspective view of a disclosed ESD protection device 180 comprising a vertical NPN transistor with a plurality of DT isolation islands $125_1$ to $125_{15}$ located within the DT islands 125. In the illustrated example, the DT islands 125 are located between the collector contacts 117a and the base 118. In this arrangement, current flowing between the collector contacts 117a and the emitter 119 is directed to directly flow through the merged deep-n region 125a between the DT islands 125 to the BL. This direction of current may provide beneficial performance in some examples.

Figure 1D:
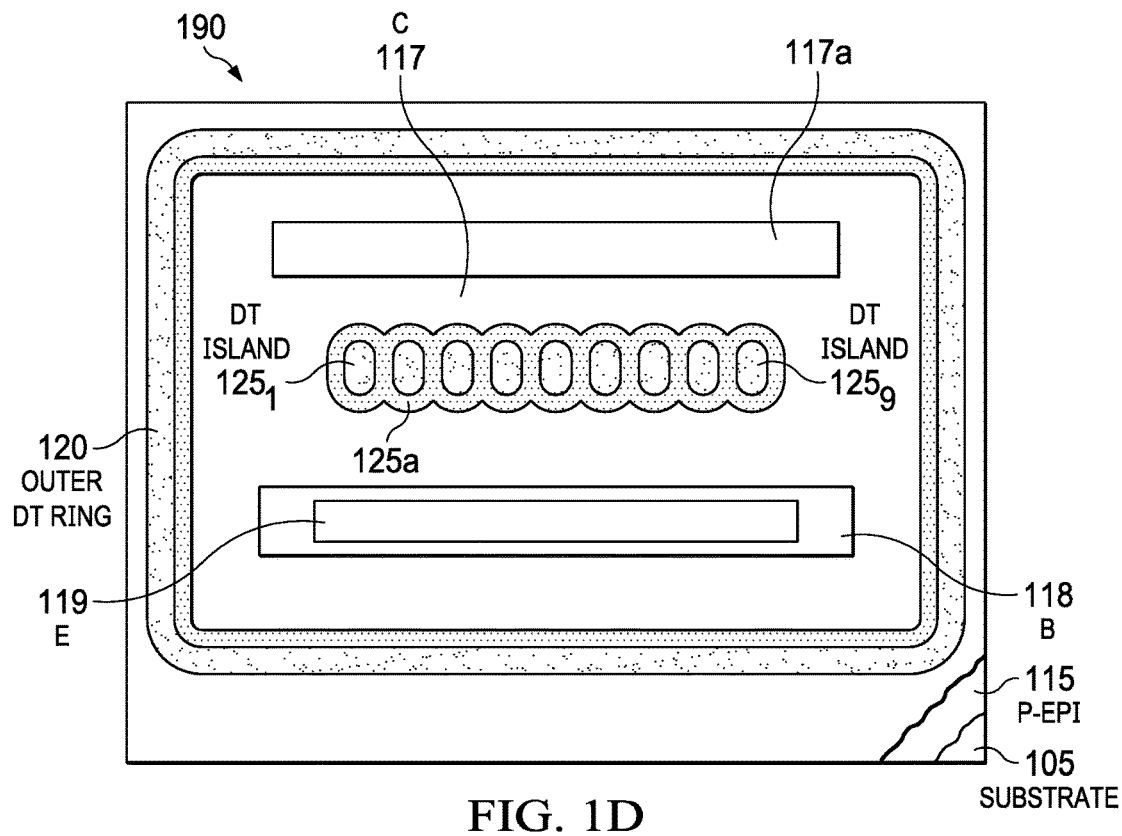
FIG. 1D is a top perspective view of a disclosed ESD protection device comprising a vertical NPN transistor with a plurality of DT isolation islands between the collector contact and the base in a single row with merged deep-n doping in the collector of the NPN transistor, with an optional outer DT isolation ring shown, where the DT isolation islands do not extend across a width of the device from one side of the outer DT ring to its opposite side, according to a disclosed example.

FIG. 1D is a top perspective view of a disclosed ESD protection device 190 comprising a vertical NPN transistor with a plurality of DT isolation islands $125_1$ to $125_9$ between the collector contact 117a and the base 118 in a single row with merged deep-n doping in the collector 117 of the NPN transistor, with an optional outer DT isolation ring 120 again shown. The DT isolation islands $125_1$ to $125_9$ are shown optionally not extending completely between opposite sides of the outer DT ring 120, such that portions of the collector 117 are located between the DT islands 125 and the outer DT ring 120. In such examples, the merged deep-n region 125a may still increase the resistance between the collector contact 117a and the emitter 119, but need not completely span the distance between the opposite outer DT rings 120 as might be needed if dielectric isolation were instead used.

Figure 2A:
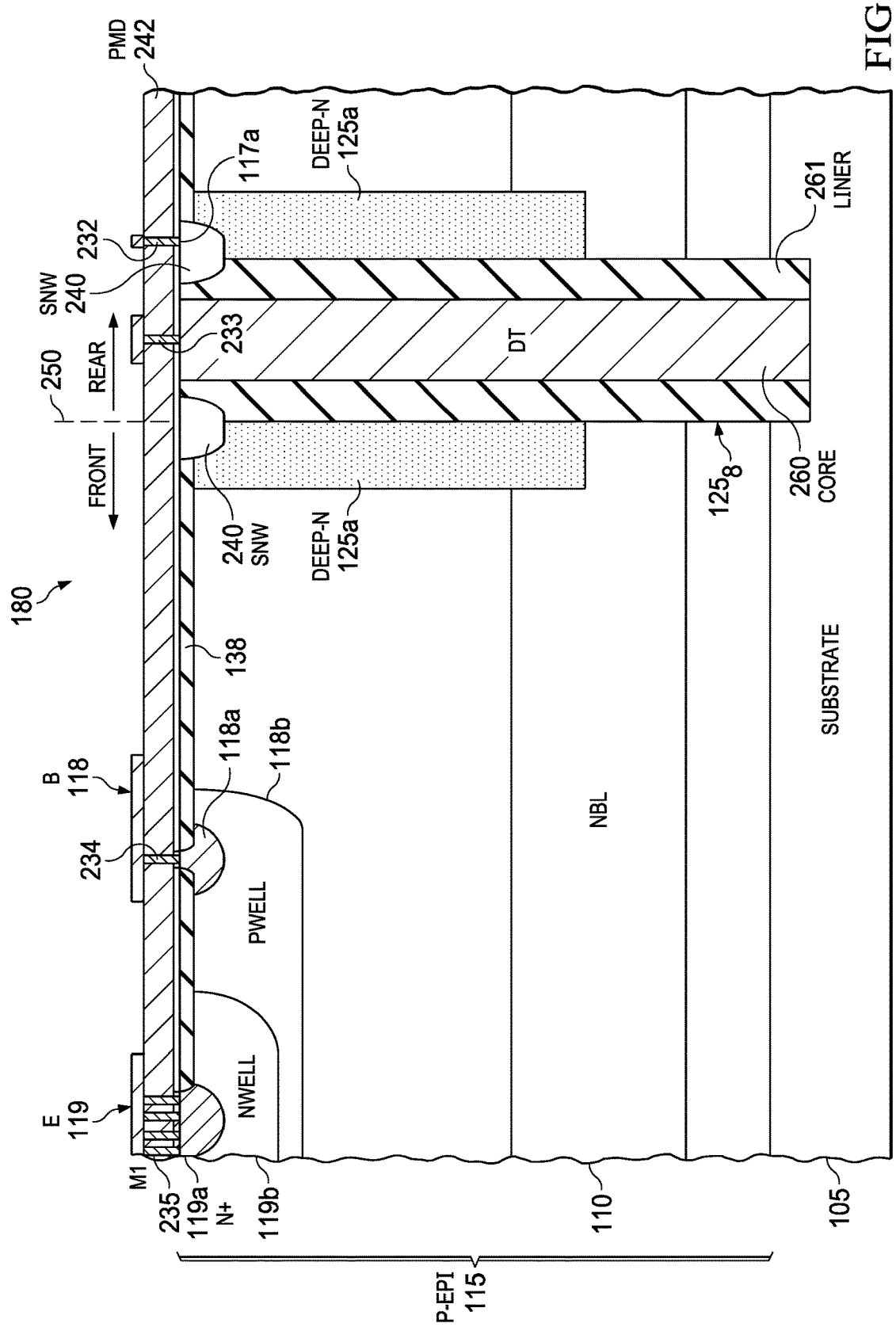
FIG. 2A is a cross sectional depiction from the marked cutline shown in FIG. 1C of a disclosed ESD protection device showing a single DT isolation island with a collector contact to the deep-n region being only on the side of the DT isolation island opposite to the base and emitter of the NPN transistor.

FIG. 2A is a cross sectional depiction from the marked cutline 2A-2A of the ESD protection device 180 shown in FIG. 1C including the SNW 240 not explicitly shown in FIGS. 1A-1D. ESD protection device 180 is shown with a single one of its DT isolation islands shown as $125_8$ that is between the contact 232 that is through a pre-metal dielectric (PMD) layer 242 to the collector contact 117a, such as a PMD comprising silicon oxide. Other contacts shown comprise an emitter contact 235 through the PMD layer 242 to an n+ contact 119a in an nwell 119b at the surface of the emitter 119, and a base contact 234 through the PMD layer 242 to a p+ base contact 118a to a pwell 118b at the surface of the base 118.

Although the SNW 240 is shown within the merged deep-n region 125a, the SNW 240 can optionally extend beyond the perimeter of the merged deep-n region 125a, e.g. toward the outer DT ring 120, such as for the example of FIG. 1A in which the collector contact 117a is located between the DT islands 125 and the outer DT ring 120. The SNW 240 provides a conductive n-doped path for current from the collector contact 117a to the merged deep-n region 125a. Forming the SNW 240 may use a mask level used in a MOSFET or BiCMOS process, thus needing no additional mask level. The lateral extent of the collector 117 away from the base 118 may be considered to be primarily determined by the lateral extent of the merged deep-n region 125a, and also the SNW 240 if it extends beyond the merged deep-n region 125a.

The collector contact 117a is shown optionally located over the SNW 240 in the merged deep-n region 125a, while in some other examples instances of the collector contact 117a may be located over a portion of the semiconductor surface provided it is doped with the right type (n-type for NPN, such as when the region is also N-type between the DT islands 125 and the collector contact 117a), such as having a SNW 240, that is thus not located over the merged deep-n region 125a. As discussed further below instances of the collector contacts 117a are excluded from the portion of the collector 117 that is located between the DT islands 125 and the base 118 and emitter 119. The NBL 110 is shown located within the p-epi layer 115, which may be formed conventionally. The NBL 110 provides a path for the lateral flow of current between the collector contact 117a and the emitter 119, and although not shown in FIG. 2A (and not shown in FIGS. 2B and 3G described below), the NBL 110 also includes a portion that extends up to reach the bottom of the base 118.

There is also a contact 233 through the PMD layer 242 to the p-doped polysilicon core 260 of the DT isolation island $125_8$, where the DT isolation island $125_8$ has a liner oxide 261. Metal 1 (M1) is shown making contact to the respective contacts. Optionally one or more additional first inter-level dielectric (ILD) layers and interconnect layers may be formed over M1 as needed to support interconnections to other devices on the substrate 105. Shallow trench isolation (STI) 138 is shown on the surface of the p-epi layer 115, which can also be a LOCal Oxidation of Silicon (LOCOS) field oxide.

A datum line 250 is shown in FIG. 2A coincident with the surfaces of the DT islands 125 on a side nearest to the emitter 119. The portion of the merged deep-n region 125a located between the datum line 250 and the emitter 119 is referred to herein as the "front portion" of the merged deep-n region 125a, while the portion of the merged deep-n region 125a located on the side of the device 180 opposite from the front portion is referred to herein as the "rear portion" of the merged deep-n region 125a. As shown in FIG. 2A, all collector contacts 117a are located in the rear portion of the merged deep-n region 125a in this example.

Figure 2B:
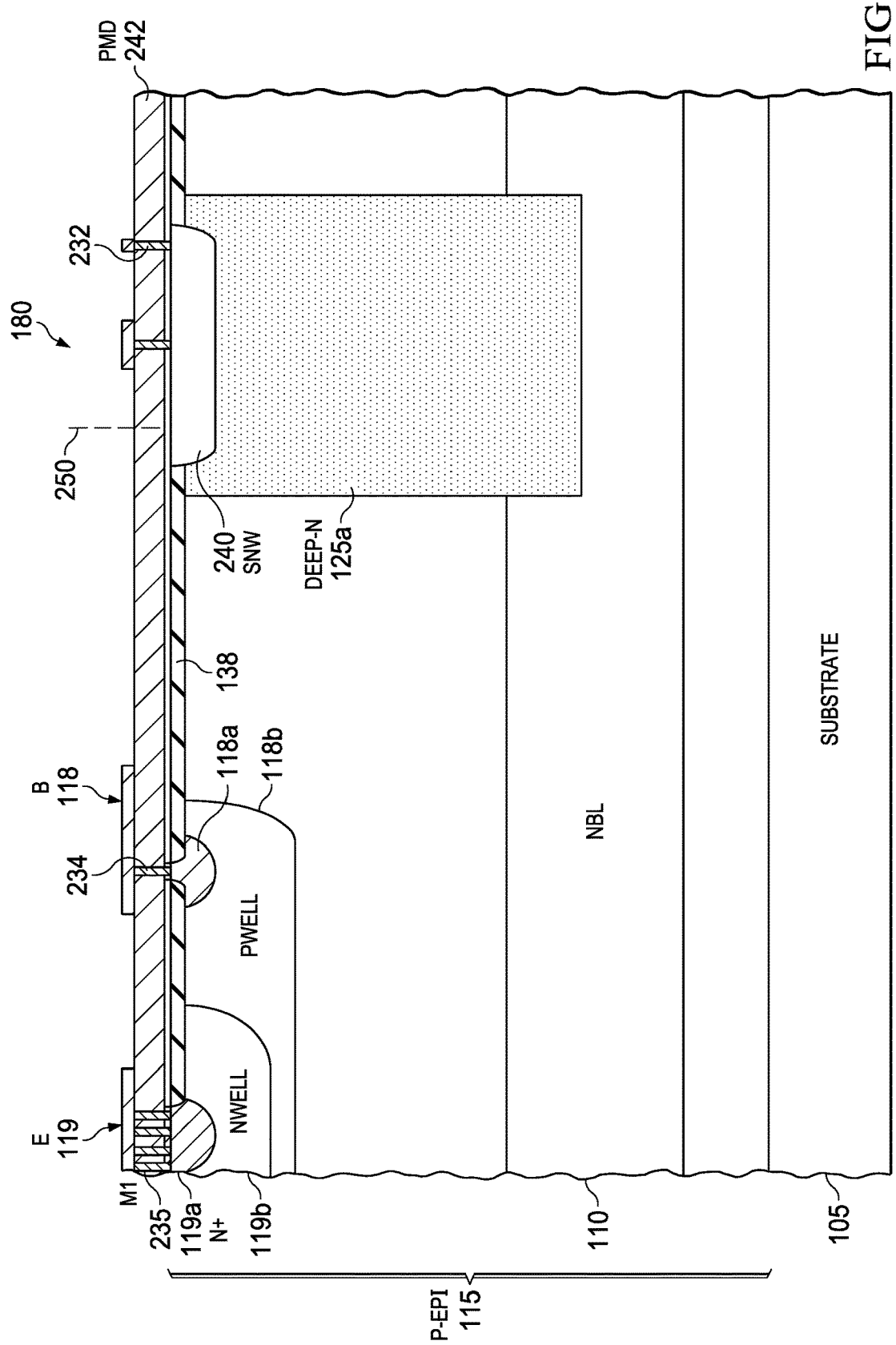
FIG. 2B is a cross sectional depiction from the marked cutline shown in FIG. 1C that is between two DT isolation islands.

FIG. 2B is another cross-section of the device 180 taken at the corresponding cutline shown in FIG. 1C that is between two DT isolation islands. In this location the merged deep-n region 125a is continuous in the plane of the substrate 105 between the vertical boundaries of the merged deep-n region 125a. Thus during device operation current between the collector from the collector contact 117a to the emitter 119 may flow primarily through the rear portion of the merged deep-n region 125a, and to a lesser extent through the front portion of the merged deep-n region 125a between the datum line 250 and the emitter 119 by way of the merged deep-n region 125a. It will be appreciated that the presence of the DT islands 125 reduces the cross sectional area of the merged deep-n region 125a available for lateral/horizontal conduction into the front portion of the merged deep-n region 125a, effectively increasing the resistance of that conductive path.

Thus contacting the merged deep-n region 125a only on the rear portion of the collector 117 results in a somewhat more resistive path as compared to contacting the merged deep-n region 125a on both sides of the datum line 250. This increased resistance can help improve the current carrying capability of the ESD protection device in at least two ways. One way is by creating negative feedback (through added resistance) which may counter feedback (snapback) and improve the stability of the performance of the ESD device by avoiding filamentation, thus increasing reliability. The additional resistance may also improve the performance of the device by directing a greater portion of the current towards vertical conduction, thereby increasing the cross-section of the conductive path as the current pushes vertically to the NBL 110.

Figure 2C:
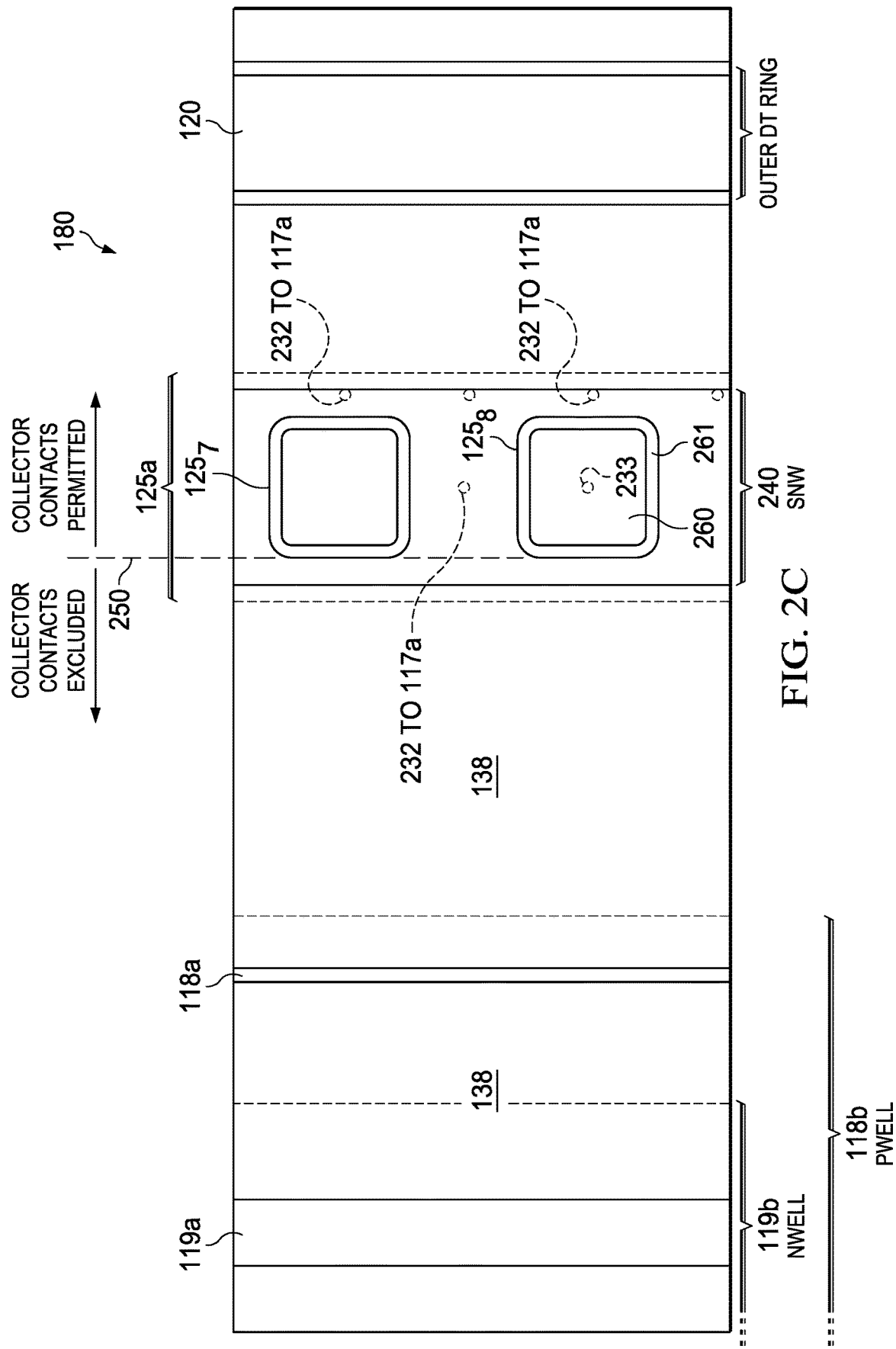
FIG. 2C is a detail of the FIG. 1C top view.

FIG. 2C is a detail top view corresponding to the FIG. 1C cross sectional depiction of a disclosed ESD protection device 180. There are several collector contacts 117a shown that connect a collector terminal 232 to the merged deep-n region 125a. The collector contacts 117a are shown directly over the merged deep-n region 125a. However, as described above in some other arrangements one or more collector contacts 117a may be located on a side of the DT islands opposite the base 118 and emitter 119 over an n-type region that connects to the NBL, such as having the SNW 240 at the surface extending beyond the merged deep-n region 125a between the DT islands 125 and the DT isolation ring 120. The datum line 250 is again shown coincident with the surfaces of the DT islands 125 on a side nearest the emitter 119. In various examples, and as illustrated in FIG. 2C, collector contacts to the merged deep-n region 125a are excluded between the datum line 250 and the emitter 119 (the front portion of the merged deep-n region 125a) shown in FIG. 2C as "collector contacts excluded", with "collector contact permitted" being shown for the rear portion of the merged deep-n region 125a. There is also shown the optional contact 233 (through the PMD) to the p-doped polysilicon core 260 of the DT isolation island 125$_8$, which in some examples may be used in operation to connect the substrate 105 to a known potential, e.g. ground.

Figure 3A:
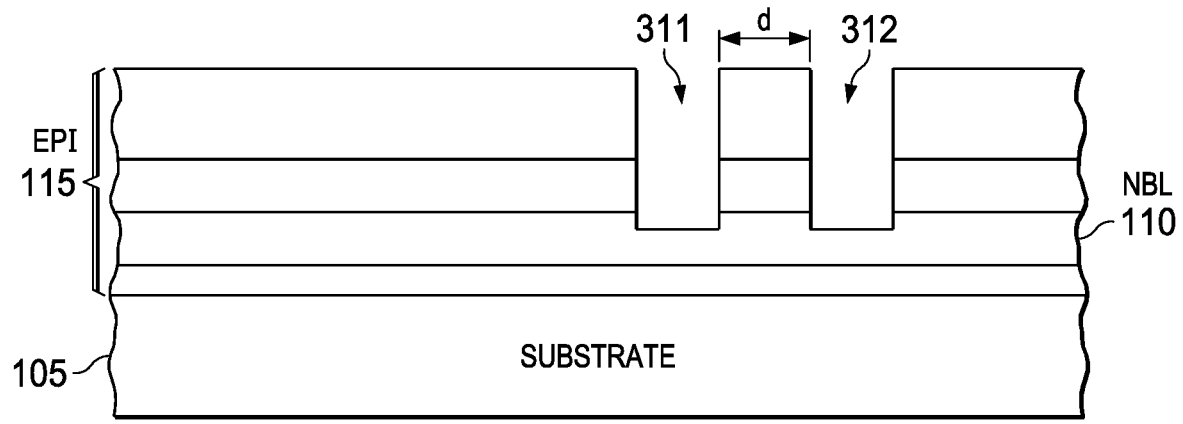
FIGS. 3A-3G are cross-sectional diagrams showing processing progression for an example method of forming an IC having a disclosed ESD protection device comprising an NPN transistor with DT isolation islands in the collector having merged deep-n doping, according to a disclosed example.

FIGS. 3A-3G are cross-sectional diagrams showing processing progression for certain processing steps for an example method of forming an IC having a disclosed ESD protection device with DT isolation islands in the collector having a merged deep-n region (for NPN) or deep-p region (for PNP) doping, according to a disclosed example. Without implied limitation the method is described in terms of the structural features of the device 180 shown in FIG. 2A, but for the example of two rows of staggered DT islands 125. Referring first to FIG. 3A, prior to forming DT apertures 311, 312, a first epi layer can be grown on a substrate 105. For example, the first epi layer can be a p-epi layer about 17 µm thick and have a p-type doping concentration of about $1 \times 10^{15}$ cm$^{-3}$. An n-type implant can follow to form the NBL 110. A second epi layer can then be formed, such as about 7 µm thick having a p-type doping concentration of about $1 \times 10^{15}$ cm$^{-3}$. Another p-epi layer may then be grown, such as being about 6.5 µm thick and having a p-type doping concentration of about $1 \times 10^{15}$ cm$^3$. The combined epi-layers are collectively shown in FIG. 3A as the epi layer 115.

The DT islands 125 are then formed either in the first doped region that is doped the first doping type (e.g., n-collector), or in a region that will be later be doped to become the first doped region (e.g., n-collector). A masked DT etch, such as reactive ion etching (RIE), can been used to form apertures 311, 312 for the DT islands 125, generally being at least 5 µm deep, such as 10 µm to 15 µm deep, that at least reaches the NBL 110. FIG. 3A shows the in-process device after a DT etch has been performed, showing the DT apertures 311, 312 spaced apart by a spacing distance shown as d. The spacing d should be small enough so that the dopant from a later deep-n implant merges together from neighboring DT islands 125 to form a merged deep-n region. This spacing d is dependent on the width of the DT islands and the extent of out-diffusion of dopant from the angled deep-n or other deep implant. In some examples a spacing value between about 0.8 µm and about 2.5 µm is generally acceptable. As used herein throughout, "about" refers to ±20%. A deep-n or deep-p angled implant is performed through the apertures 311, 312 with a DT mask (not shown) is still present, which may have a thickness of about 13 µm.

Figure 3B:
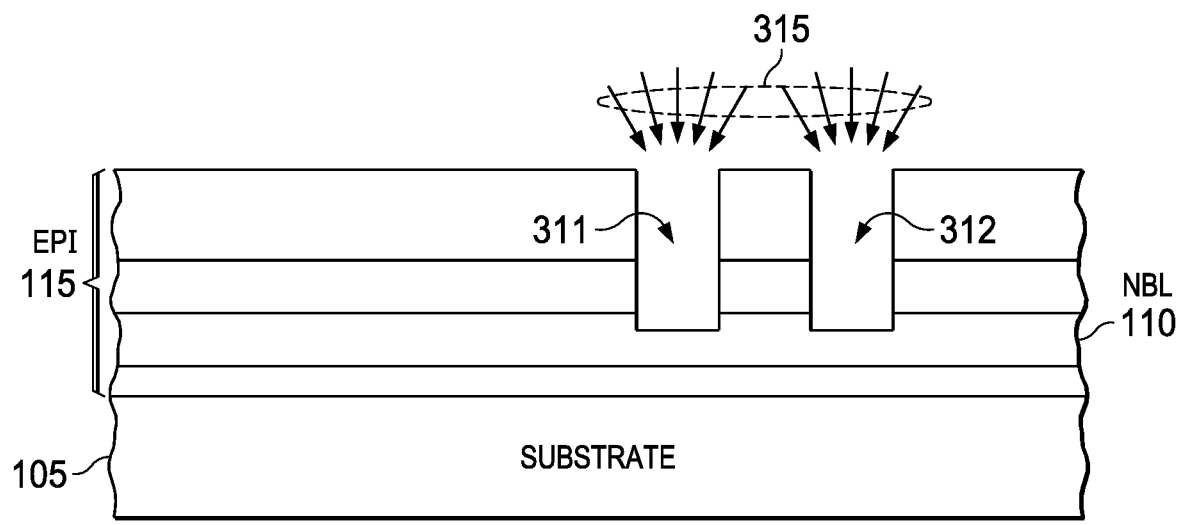
Figure 3C:
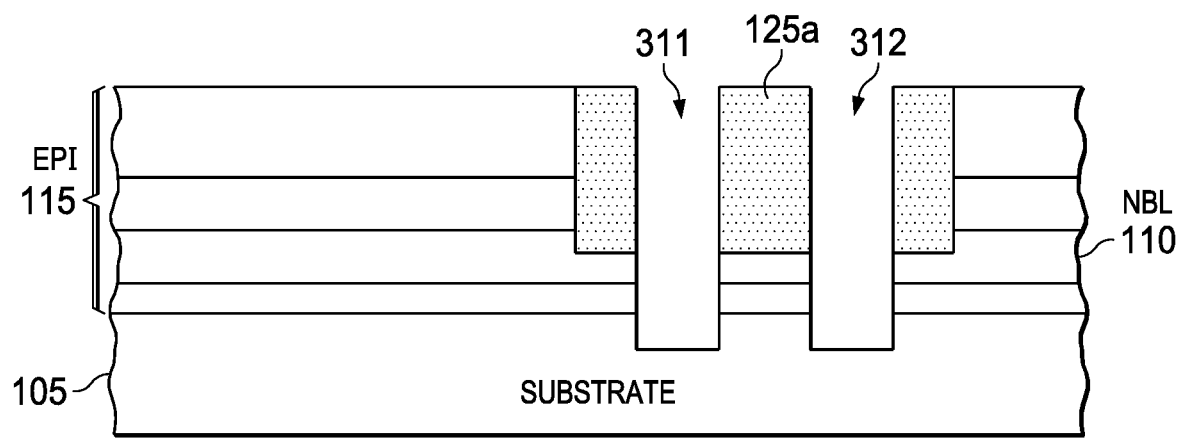

FIG. 3B shows an angled deep-n implant 315, which may be performed with a same mask level as used for a deep trench mask. This implant places the dopant into the semiconductor sidewalls of the DT apertures 311, 312. The implant angle depends on the width and depth of the DT. However, an implant angle range of 10 to 16 degrees (relative to the normal to the semiconductor surface) can be generally considered appropriate for the angled implant. The deep-n implant dose may include a phosphorous implant dose in a range between about $5 \times 10^{13}$ cm$^{-2}$ and about $5 \times 10^{14}$ cm$^2$ with an energy in a range between about 150 keV and about 250 keV. A second masked DT etch can then follow to extend the apertures deeper 311, 312 to reach the substrate 105. FIG. 3C shows the in-process structure after a second DT etch that also shows the deep-n regions merged into to form a merged deep-n region 125a, which may be merged as implanted at the first activation or may be merged by a later activation/diffusion anneal step in the process flow.

Figure 3D:
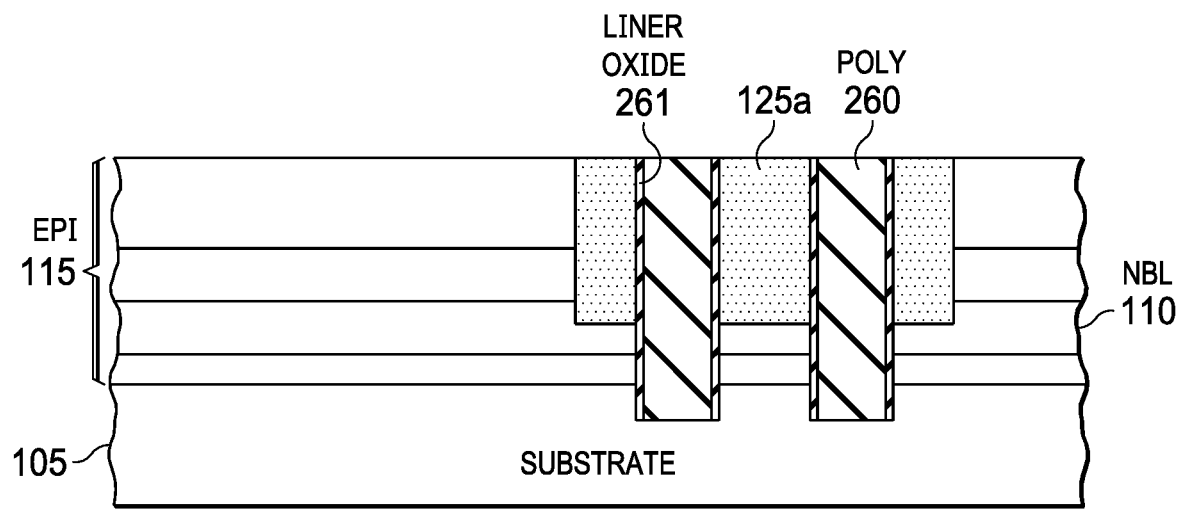

FIG. 3D illustrates the device after formation of the oxide liner 261 on the sidewalls of the apertures 311, 312, and formation of the polysilicon cores 260. The oxide liner 261 may be formed by a thermal oxidation of the sidewalls of the apertures 311, 312, and may have a thickness in a range between about 0.2 µm and about 0.3 µm. In some examples the bottom of the liner oxide 261 is removed, such as to enable the polysilicon core 260 to make contact to the substrate 105 through the bottom of the apertures 311, 312. An in-situ p+ polysilicon deposition can provide doped polysilicon without the need for an implant step to enable the as-deposited polysilicon fill material to electrically connect the core of the DT islands 125 to the substrate 105 when the substrate is p-type. In other some examples the bottom of the liner oxide 261 is not removed, such as when DT structures elsewhere on the device may be used to form an isolated capacitor. In either case polysilicon patterning then follows, such as using Chemical Mechanical Planarization (CMP) to remove the polysilicon overburden.

In some examples conventional BiCMOS devices may be formed elsewhere over the substrate 105. Some such processing is well-known, and is briefly described here. P-type and n-type well regions (e.g., SNWs) may be implanted, followed by forming STI structures and possibly forming additional well regions. A gate oxide layer may be formed (for low voltage and high voltage MOS devices), and polysilicon gates and gate sidewalls may be formed over the gate oxide layer. Lightly doped drain (LDD) regions may be formed near the gates using spacers, and n+ source and p+ drain implants may be formed to provide ohmic contacts to various doped regions.

Figure 3E:
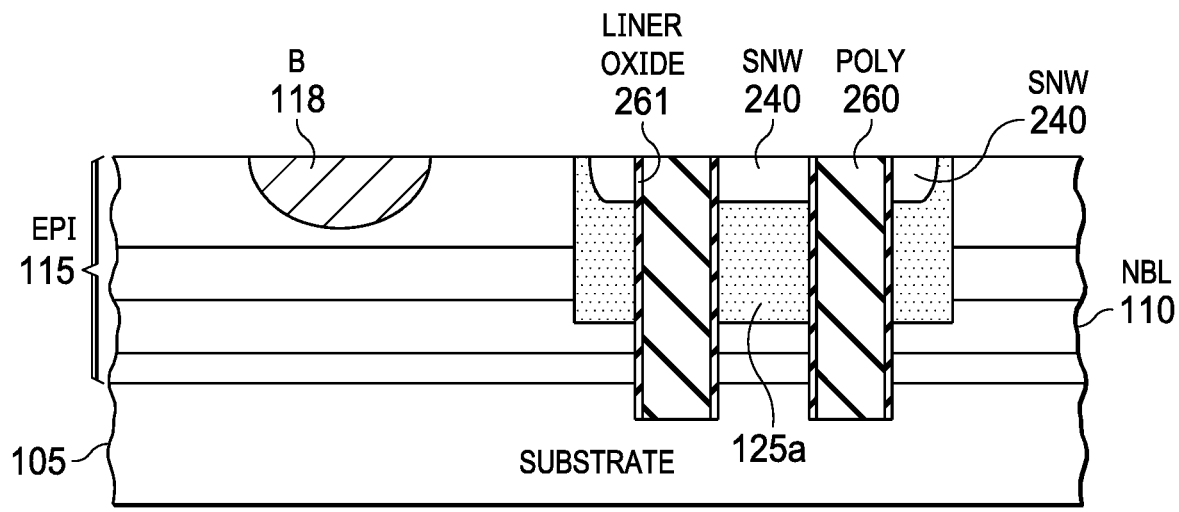
Figure 3F:
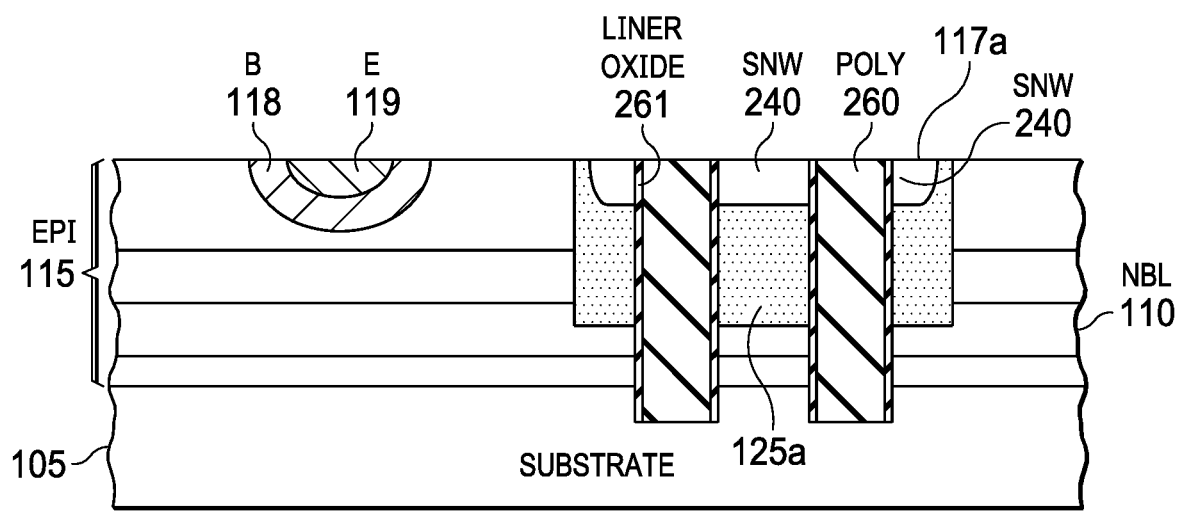

FIG. 3E shows the in-process structure after a p-well formation step that may be used to form a BiCMOS device, forming a p-base shown as base (B) 118, e.g. by a boron ion implant, and formation of the SNW 240 at the surface of the merged deep-n region 125a, generally by an n-type implant. FIG. 3F shows the in-process structure after an nwell formation step that may be used to form a BiCMOS device, the source and drain n-type ion implant, which is a masked implant that forms an n-emitter (E 119) within the base 118. This implant also forms the collector contact 117a of the collector shown in the SNW 240 at the surface of the merged deep-n region 125a on the rear portion of the merged deep-n region 125a. As described previously, the collector contacts 117a are excluded from the front portion of the merged deep-n region 125a. As a result during device operation a portion of the current that flows between the collector contact 117a to the emitter 119 is directed to vertically flow through the merged deep-n region 125a between the DT islands down to the BL 110, then laterally in the NBL 110 to under the base 118. The SNW 240 may be formed during an nwell-implant of a BiCMOS device process.

Processing may continue with conventional or nonconventional formation of interconnect layers. Such processing may include, e.g. forming a PMD layer and contacts in the PMD layer (see, e.g. FIG. 2A, with contacts 232, 233, 234 and 235 through the PMD layer 242). Contact formation, e.g. by forming tungsten plugs, may be followed by formation of a metal stack including, for example, two or more metal levels. Neighboring metal levels may be separated by an ILD having vias between the metal levels, e.g. tungsten or copper.

Figure 3G:
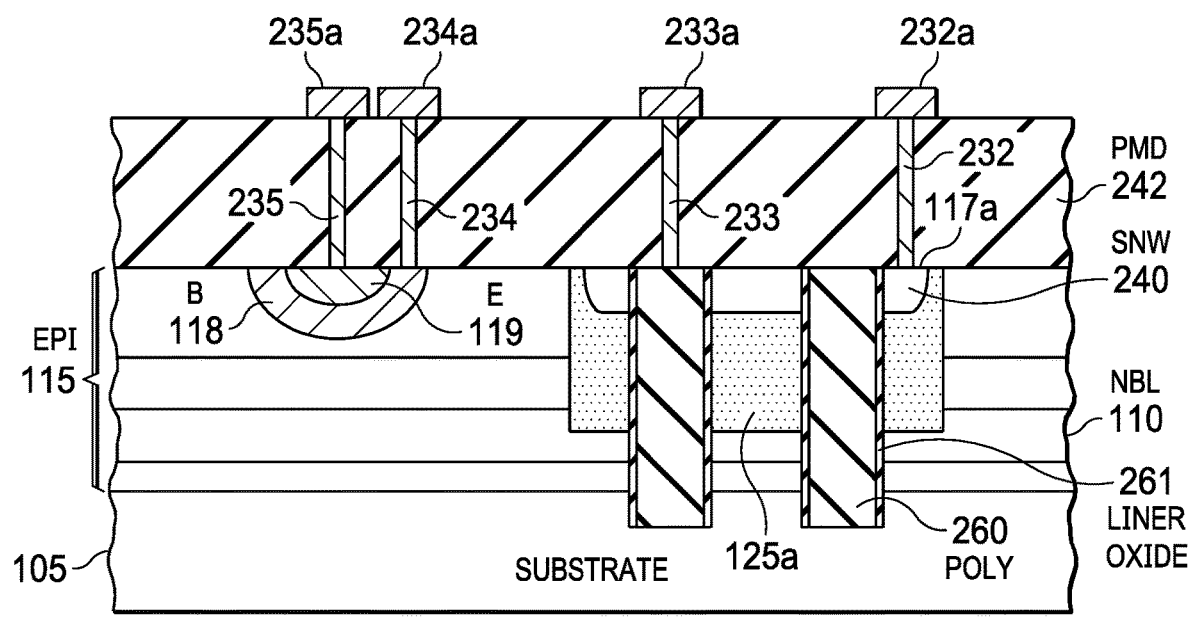

FIG. 3G shows the in-process device after forming a PMD 242. The illustration includes the contact 232 to the collector contact 117a in the merged deep-n region 125a, the contact 233 to the polysilicon core 260, the contact 234 to the base 118, and the contact 235 to the emitter 119. Corresponding MET1 lines shown as 232a, 233a, 234a and 235a connect to each of these respective contacts.

FIG. 4 illustrates a high level depiction of an ESD protected IC 400 into which a plurality of disclosed ESD cells being ESD protection device 100 with DT islands with merged deep-n regions are incorporated to protect one or more terminals of the IC, according to a disclosed example. The "T" shown indicated at the top of the respective ESD protection devices 100 in FIG. 4 represents an input responsive to an ESD event provided by a suitable trigger circuit.

IC 400 includes functional circuitry 424, which is integrated circuitry that realizes and carries out desired functionality of IC 400, such as that of a digital IC (e.g., digital signal processor) or analog IC (e.g., an amplifier or a power converter). The capability of functional circuitry provided by IC 400 may vary, for example ranging from a simple device to a complex device. The specific functionality contained within functional circuitry 424 does not imply any limitation on the disclosed examples.

IC 400 also includes a number of external terminals, by way of which functional circuitry 424 carries out its function. A few of those external terminals are illustrated in FIG. 4. It is to be understood that the number of terminals and their function can also vary widely. In the example of IC 400 shown in FIG. 4, two terminals shown operate as common input and output terminals (I/O), by way of which functional circuitry 424 can receive incoming signals and can generate outputs, as well known in the art. A dedicated input terminal IN is also shown in FIG. 4 for IC, as is a dedicated output terminal OUT. Each of terminals IN, OUT are also connected to functional circuitry 424. Power supply terminal $V_{DD}$ receives a positive power supply voltage in this example, while ground terminal $V_{SS}$ is provided to receive a reference voltage, such as system ground. Although not shown, the ground shown connected to the ESD protection devices 100 is coupled to $V_{SS}$, such as resistively coupled or shorted together.

IC 400 includes an instance of the disclosed ESD protection device 100 connected to each of its terminals. Each ESD protection device 100 is connected to its corresponding terminal in parallel with the functional circuitry 424. ESD protection devices 100 are also connected to power supply and reference voltage terminals $V_{DD}$, $V_{SS}$, in parallel with functional circuitry 424. However, in some applications, some pins of the IC 400 being protected may be self-protecting, such as diode protected power supply pins. Pins also can be protected against different levels of ESD strike (Human Body Model (HBM), Charged Device Model (CDM), IEC standard IEC (e.g., IEC 61000-4-2), etc. The functional circuitry 424 in IC 400 can be BiCMOS circuitry having bipolar transistors and MOSFETs.

EXAMPLES

Disclosed examples are further illustrated by the following specific Examples, which should not be construed as limiting the scope or content of this Disclosure in any way.

FIG. 5A shows normalized TCAD simulated I-V characteristics of an ESD protection device with a single outer DT ring shown as a baseline and a disclosed ESD protection device with a single row of DT islands having merged deep-n doping inside the DT ring shown as 'DT islands', consistent with some described examples. The clamp voltage for the disclosed ESD protection device can be seen to be about 5 V lower as compared to the ESD protection device that lacks the row of DT islands, thus providing snapback protection at a lower voltage than the baseline device.

FIG. 5B shows normalized measured I-V data from 100 ns TLP testing comparing an ESD protection device with an outer DT ring, but lacking a row of DT islands in the collector, to a disclosed ESD protection device having within the collector two staggered rows of DT islands having merged deep-n doping. The horizontal offset from the DT-ring-only characteristics (triangle and x symbols) to the DT islands characteristic (squares and circles) represents a reduction in the clamp voltage due to the presence of the DT islands. A 7 V to 10 V clamp voltage reduction for the disclosed ESD protection device can be seen.

DT islands in multiple rows placed in a staggered configuration may improve manufacturability and may remove the need for an outer DT ring. Also the DT dopant out-diffusion is significantly less compared to a deep-n only arrangement. Staggered DT islands may improve manufacturability better than straight parallel rows because of reduced stress in the semiconductor surface. Isolation is still maintained if the DT islands are placed close enough that that deep-n regions merge, thereby providing isolation and a low resistance collector path as well with the isolation provided thus eliminating the need for the conventional outer DT ring. The elimination of the outer DT ring may be beneficial to reduce the DT density, which may improve manufacturability by further reducing the stress in the semiconductor surface and thus the possibility for fracture and defects.

Disclosed examples can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other examples are possible within the scope of the claimed invention, and further additions, deletions, substitutions and modifications may be made to the described examples without departing from the scope of this Disclosure.

The invention claimed is:

1. A method of fabricating an electronic device, comprising:
   forming a first doped region and a second doped region each having a first conductivity type in a semiconductor surface layer of a substrate, the substrate having a second conductivity type and a buried layer (BL) having the first conductivity type;
   forming a third doped region having the second conductivity type between the first and second doped regions in the semiconductor surface layer; and
   forming a plurality of dielectric structures within the first doped region, each dielectric structure extending from the semiconductor surface layer to at least the BL.

2. The method of claim 1 further comprising forming a merged deep doped region of the first conductivity type that extends from the semiconductor surface layer to the BL and spans the plurality of dielectric structures.

3. The method of claim 1, wherein the plurality of dielectric structures each include an electrically conductive core that electrically connects to the substrate.

4. The method of claim 1, wherein the plurality of dielectric structures are arranged in a line normal to a direction from the second doped region to a contact to the first doped region.

5. The method of claim 1, wherein the first and second doped regions are respectively configured to operate as a collector and an emitter of a bipolar transistor, and the third doped region is configured to operate as a base of the bipolar transistor.

6. The method of claim 1, wherein the second and third doped regions extend into the substrate by respective second and third depths, and wherein the first doped region extends into the substrate by a first depth greater than the second and the third depths.

7. The method of claim 1, further comprising forming a contact to the first doped region, and excluding any contact to the first doped region between the plurality of dielectric structures and the third doped region.

8. A method of fabricating an electronic device, comprising:
   forming a first doped region and a second doped region each having a first conductivity type in a semiconductor surface layer of a substrate having a second conductivity type and a buried layer (BL) having the first conductivity type;
   forming a third doped region having the second conductivity type between the first doped region and the second doped region;
   forming a row of deep trench (DT) openings in the semiconductor surface layer within the first doped region, wherein the DT openings reach the BL;
   implanting a dopant of the first conductivity type through the DT openings thereby forming deep doped regions extending from the semiconductor surface layer to the BL for each of the DT openings, and,
   filling the DT openings thereby forming a plurality of DT isolation islands that each include at least a dielectric liner;
   wherein the deep doped regions of merge into a merged deep doped region that spans the plurality of DT isolation islands.

9. The method of claim 8, further comprising forming an outer DT isolation ring, where the plurality of DT isolation islands extend from one side of the DT isolation ring to an opposite side of the DT isolation ring.

10. The method of claim 8, further comprising forming a shallow well having the first conductivity type within the merged deep doped region.

11. The method of claim 8, wherein the row of DT openings is a first row of DT openings, and further comprising forming a second row of DT openings, wherein the first and second rows are staggered relative to one another.

12. The method of claim 8, wherein the first and second doped regions and the BL are configured to operate as a protection device that comprises a vertical bipolar transistor, further comprising forming contacts including at least one contact to the first doped region that contacts the merged deep doped region or a side of the merged deep doped region opposite to the third doped region and the second doped region.

13. An electronic device, comprising:
   a semiconductor surface layer of a substrate having a second conductivity type and including a buried layer (BL) having a first conductivity type;
   a second doped region having the first conductivity type within an area enclosed by a third doped region having the second conductivity type, and a first doped region having the first conductivity type spaced apart from the third doped region and extending from a surface of the substrate to the BL;
   at least one row of deep trench isolation (DT) islands within the first doped region that each include a dielectric liner extending along a trench sidewall from the semiconductor surface layer to the BL, and
   a merged deep doped region comprising deep doped regions that extends from the semiconductor surface layer to the BL for each of the DT islands.

14. The electronic device of claim 13, wherein the at least one row comprises first and second rows of DT islands, the DT islands of the first row being offset with respect to the DT islands of the second row.

15. The electronic device of claim 13, wherein the DT islands each comprise a polysilicon filler that provides an electrical connection to the substrate below the BL, and wherein the dielectric liner is located between the polysilicon filler and the substrate.

16. The electronic device of claim 13, wherein the first doped region is configured to operate as a collector, the second doped region is configured to operate as an emitter, and the third doped region is configured to operate as a base of a vertical bipolar transistor, and further comprising contacts including at least one contact to the collector that contacts the merged deep doped region on a side of the merged deep doped region opposite to the base and the emitter.

17. The electronic device of claim 16, wherein the contact to the collector contacts the merged deep doped region such that current between the collector and the emitter is directed to flow through the merged deep doped region between the DT islands to the BL.

18. The method of claim 1, wherein the dielectric structures are arranged as a first and a second row, wherein the first and second rows are staggered relative to one another.

19. The method of claim 1, further comprising forming a deep trench isolation ring that laterally surrounds the first, second and third doped regions.

20. The method of claim 2, further comprising forming a deep trench isolation ring that laterally surrounds the first, second and third doped regions, wherein the merged deep doped region connects between first and second locations of the deep trench isolation ring.

21. The method of claim 1, wherein forming the first doped region includes forming a merged deep doped region and a shallow well within the merged deep doped region.

22. The method of claim 1, wherein the first conductivity type is N-type and the second conductivity type is P-type.

23. A method of fabricating an electronic device, comprising:
- forming a first doped region and a second doped region each having a first conductivity type in a semiconductor surface layer of a substrate, the substrate having a second conductivity type and a buried layer (BL) having the first conductivity type;
- forming a third doped region having the second conductivity type between the first and second doped regions in the semiconductor surface layer;
- forming a plurality of dielectric structures within the first doped region, each dielectric structure extending from the semiconductor surface layer to at least the BL; and
- forming a merged deep doped region of the first conductivity type that extends from the semiconductor surface layer to the BL and spans the plurality of dielectric structures.

* * * * *